US008466741B2

(12) United States Patent
Umeda (10) Patent No.: US 8,466,741 B2
(45) Date of Patent: Jun. 18, 2013

(54) TRANSIMPEDANCE AMPLIFIER, INTEGRATED CIRCUIT AND SYSTEM (75) Inventor: Daisuke Umeda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/266,737

(22) PCT Filed: Feb. 14, 2011

(86) PCT No.: PCT/JP2011/053036
§ 371 (c)(1),
(2), (4) Date: Oct. 27, 2011

(87) PCT Pub. No.: WO2011/152083
PCT Pub. Date: Dec. 8, 2011

(65) Prior Publication Data
US 2012/0176199 A1    Jul. 12, 2012

(30) Foreign Application Priority Data
Jun. 3, 2010  (JP) .............................. P2010-127919

(51) Int. Cl.
*H03F 1/14* (2006.01)
*H03F 1/22* (2006.01)
(52) U.S. Cl.
USPC ................................ 330/51; 330/96; 330/311
(58) Field of Classification Search
USPC ................................ 330/51, 98–100, 295, 311
See application file for complete search history.

(56) References Cited

U.S. PATENT DOCUMENTS

| 5,202,553 A | 4/1993 | Geller |
| 7,944,290 B2 * | 5/2011 | Yeung et al. .................. 330/51 |
| 2010/0188154 A1 | 7/2010 | Yeung et al. |

FOREIGN PATENT DOCUMENTS

| JP | S63-000514 A | 1/1988 |
| JP | 7-505508 | 6/1995 |
| JP | 11-088067 | 3/1999 |
| JP | 2004-288243 | 10/2004 |
| JP | 2005-268960 | 9/2005 |
| JP | 2010-124353 | 6/2010 |

OTHER PUBLICATIONS

Japanese Notice of Allowance, and English translation thereof, issued in Japanese Patent Application No. 2010-127919 dated Jul. 24, 2012.
English translation of the International Preliminary Report on Patentability issued on Jan. 17, 2013.

* cited by examiner

*Primary Examiner* — Steven J Mottola
(74) *Attorney, Agent, or Firm* — McDermott Will & Emery LLP (57) ABSTRACT

An integrated circuit according to one embodiment includes a first transimpedance amplifier and a second transimpedance amplifier. In the integrated circuit, one of the first transimpedance amplifier and the second transimpedance amplifier is set into an enabled state and the other is set into a disabled state. The first transimpedance amplifier and the second transimpedance amplifier share an input transistor. The first transimpedance amplifier has a first resistor provided between a feedback node thereof and an input node connected to the input transistor. The second transimpedance amplifier has a second resistor provided between a feedback node thereof and the first resistor. A feedback resistor of the second transimpedance amplifier is configured with a series connection of the first resistor and the second resistor.

5 Claims, 7 Drawing Sheets

TRANSIMPEDANCE AMPLIFIER, INTEGRATED CIRCUIT AND SYSTEM

RELATED APPLICATIONS

This application is the U.S. National Phase under 35 U.S.C. §371 of International Application No. PCT/JP2011/053036, filed on Feb. 14, 2011, which in turn claims the benefit of Japanese Application No. 2010-127919, filed on Jun. 3, 2010, the disclosures of which Applications are incorporated by reference herein.

TECHNICAL FIELD

The present invention relates to a transimpedance amplifier, an integrated circuit, and a system.

BACKGROUND ART

A transimpedance amplifier converts an input current into an output voltage. A current-voltage converter including such a transimpedance amplifier is described in Patent Literature 1. The current-voltage converter described in Patent Literature 1 supports a plurality of frequency signals and has a plurality of transimpedance amplifiers each provided with an operational amplifier and a feedback resistor. The resistance value of the feedback resistor of each of the transimpedance amplifiers is optimized for a supported frequency band.

CITATION LIST

Patent Literature

Patent Literature 1: Japanese Patent Application Laid-Open No. H11-88067

SUMMARY OF INVENTION

Technical Problem

In the above-described current-voltage converter, one ends of the feedback resistors are connected to an input node. This may increase a parasitic capacitance of the input node. That is, parasitic capacitances of the feedback resistors and a line length of the input node for connecting the feedback resistors may increase the parasitic capacitance.

One aspect of the present invention is to provide a transimpedance amplifier, an integrated circuit, and a system that can reduce a parasitic capacitance of an input node. The aspect of the present invention may be utilized in a transmission band of 10 Gbps or greater susceptible to an impact of the parasitic capacitance and may be used in a multi-rate PON system in which a transmission bands are switched between, for example, 10.3 Gbps and 1.25 Gbps.

Solution to Problem

One aspect of the present invention relates to an integrated circuit. An integrated circuit according to one embodiment includes a first transimpedance amplifier and a second transimpedance amplifier. The first transimpedance amplifier includes an input transistor, a first transistor, a first resistor, and a switch. The input transistor is connected to an input node. The first transistor is coupled in cascode to the input transistor. The first resistor has a first end and a second end. The first end of the first resistor is connected to the input node. The second end of the first resistor is connected to a feedback node of the first transimpedance amplifier. In one embodiment, the feedback node is an output node of the first transimpedance amplifier. The switch switches the first transimpedance amplifier between an enabled state and a disabled state.

The second transimpedance amplifier includes the input transistor, a second transistor, the first resistor, a second resistor, and a switch. The second transimpedance amplifier shares the input transistor and the first resistor with the first transimpedance amplifier. The second transistor is coupled in cascode to the input transistor. The second resistor has a first end and a second end. The switch switches the second transimpedance amplifier between an enabled state and a disabled state. The first end of the second resistor is connected to the second end of the first resistor. The second end of the second resistor is connected to a feedback node of the second transimpedance amplifier.

In the integrated circuit, the first resistor and the second resistor are connected in series to configure a feedback resistor of the second transimpedance amplifier. Thus, only the first end of the first resistor is connected to the input node. Accordingly, the integrated circuit prevents an increase in parasitic capacitance associated with an increase in the number of connected feedback resistors. In addition, since a length of a line including the input node can be reduced, an increase in the parasitic capacitance and parasitic inductance at the input node is prevented. As a result, the performance of the transimpedance amplifier is improved. In addition, since the parasitic capacitance at the input node is small, the bandwidth of the transimpedance amplifier can be broadened. In addition, since the bandwidth of the transimpedance amplifier becomes broad, a feedback resistance value can be increased to enhance a gain and reduce a noise. In addition, by reducing the parasitic inductance, unwanted peaking in frequency properties of the transimpedance amplifier can be prevented. In addition, since the resistance value of the feedback resistor of the second transimpedance amplifier is a sum of a resistance value of the first resistor and a resistance value of the second resistor, the resistance value of the second resistor can be reduced. As a result, the second resistor can be reduced in size to reduce the mounting area thereof.

In one embodiment, the integrated circuit may be provided with a control logic. The control logic supplies control signals to the switch of the first transimpedance amplifier and the switch of the second transimpedance amplifier. The control signals set one of the first transimpedance amplifier and the second transimpedance amplifier into the enabled state and the other of the first transimpedance amplifier and the second transimpedance amplifier into the disabled state.

In one embodiment, the integrated circuit may have a first region, a second region, and a third region arranged sequentially in a first direction; and a fourth region adjacent to the first to third regions in a second direction intersecting with the first direction. In the integrated circuit, the line including the input node may be provided in the first region, the input transistor, the first transistor, the switch of the first transimpedance amplifier, the second transistor, and the switch of the second transimpedance amplifier may be provided in the second region, the first resistor may be provided in one of the first region and the fourth region, the second resistor may be provided in one of the third region and the fourth region, and a line connecting the second end of the first resistor and the first end of the second resistor may extend through the fourth region. In the case where the second resistor is provided in the third region, the line connecting the second end of the first resistor and the first end of the second resistor may extend through the third region as well as the fourth region. In such a configuration, the second resistor and the line connecting the first resistor and the second resistor can be provided in regions other than the first region. Thus, the width of the first region can be reduced in the first direction. As a result, the parasitic capacitance of the input node can be reduced.

Another aspect of the present invention provides a transimpedance amplifier including the first transimpedance amplifier and the second transimpedance amplifier. Still another aspect of the present invention provides a system including the integrated circuit in any one of the embodiments and a current source.

Advantageous Effects of Invention

As explained above, the present invention provides the transimpedance amplifier, the integrated circuit, and the system that can reduce the parasitic capacitance of the input node.

DESCRIPTION OF EMBODIMENTS

Various embodiments are explained below with reference to the drawings.

Figure 1:
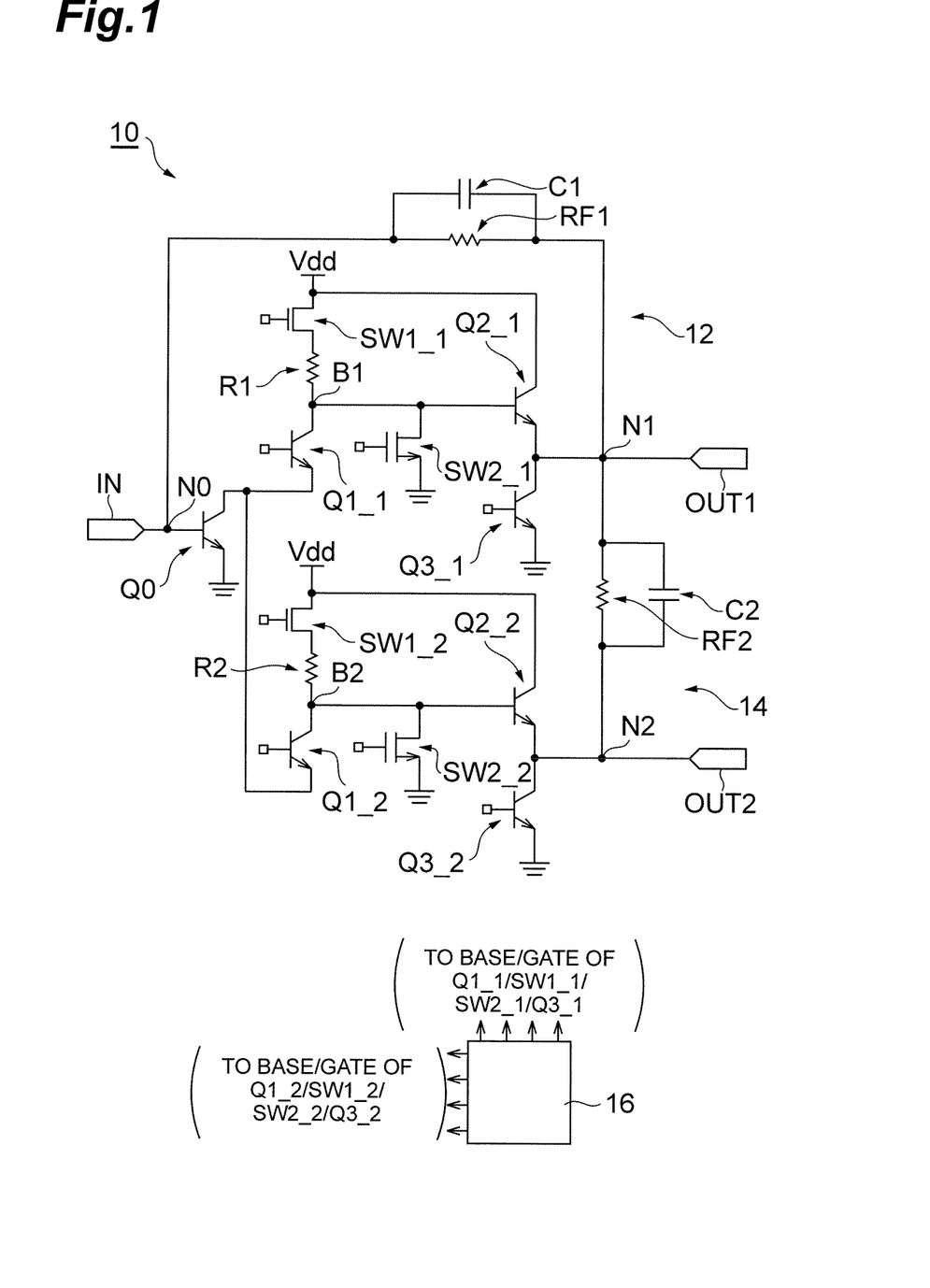
FIG. 1 is a circuit diagram of a transimpedance amplifier according to one embodiment.

FIG. 1 is a circuit diagram of a transimpedance amplifier according to one embodiment. The transimpedance amplifier shown in FIG. 1 is configured as an integrated circuit 10. The integrated circuit 10 has a first transimpedance amplifier 12 and a second transimpedance amplifier 14. For example, the first transimpedance amplifier 12 supports 10 Gb/s (gigabits per second) signals while the second transimpedance amplifier 14 supports 1 Gb/s signals. The integrated circuit 10 further includes a control logic 16.

The first transimpedance amplifier 12 includes an input transistor Q0, a first transistor Q1_1, and a first resistor RF1. The input transistor Q0 and the first transistor Q1_1 are, for example, npn bipolar junction transistors.

The first transimpedance amplifier 12 may further include a resistor R1, a capacitor C1, and transistors SW1_1, SW2_1, Q2_1, and Q3_1. The transistors SW1_1 and SW2_1 are, for example, MOS switches. The transistors Q2_1 and Q3_1 are, for example, npn bipolar junction transistors.

In the first transimpedance amplifier 12, the input transistor Q0, the first transistor Q1_1, and the resistor R1 configure a first cascode amplifier. A base of the input transistor Q0 is connected to an input terminal IN. An emitter of the input transistor Q0 is coupled to a ground. A collector of the input transistor Q0 is connected to an emitter of the first transistor Q1_1. A collector of the first transistor Q1_1 is connected to a first end of the resistor R1.

A second end of the resistor R1 is connected to the transistor SW1_1. Specifically, the second end of the resistor R1 is connected to a drain of the transistor SW1_1. A source of the transistor SW1_1 is connected to a power source (e.g., Vdd≦3.3 V) and a collector of the transistor Q2_1.

The collector of the transistor Q1_1 is also connected to the transistors SW2_1 and Q2_1. Specifically, the collector of the transistor Q1_1 is connected to a drain of the transistor SW2_1 and is connected to a base of the transistor Q2_1. A source of the transistor SW2_1 is coupled to the ground.

An emitter of the transistor Q2_1 is connected to a collector of the transistor Q3_1. An emitter of the transistor Q3_1 is coupled to the ground. In one embodiment, the emitter of the transistor Q3_1 may be coupled to the ground through a resistor.

In the first transimpedance amplifier 12, a node N1, which is connected to a node between the emitter of the transistor Q2_1 and the collector of the transistor Q3_1, configures a feedback node. The node N1 is also connected to an output terminal OUT1, thus serving as an output node.

In addition, a first end of the first resistor RF1 is connected to an input node N0 present between the base of the input transistor Q0 and the input terminal IN in the first transimpedance amplifier 12. A second end of the first resistor RF1 is connected to the node N1. Thus, the first resistor RF1 is a feedback resistor of the first transimpedance amplifier 12. In the first transimpedance amplifier 12, the capacitor C1 is provided in parallel with the first resistor RF1.

The second transimpedance amplifier 14 is explained below. The second transimpedance amplifier 14 includes the input transistor Q0, a second transistor Q1_2, and a second resistor RF2. The second transistor Q1_2 is, for example, an npn bipolar junction transistor.

The second transimpedance amplifier 14 may further include a resistor R2, a capacitor C2, and transistors SW1_2, SW2_2, Q2_2, and Q3_2. The transistors SW1_2 and SW2_2 are, for example, MOS switches. The transistors Q2_2 and Q3_2 are, for example, npn bipolar junction transistors.

In the second transimpedance amplifier 14, the input transistor Q0, the second transistor Q1_2, and the resistor R2 configure a second cascode amplifier. An emitter of the second transistor Q1_2 is connected to the collector of the input transistor Q0. A collector of the second transistor Q1_2 is connected to the first end of the resistor R2.

The second end of the resistor R2 is connected to the transistor SW1_2. Specifically, the second end of the resistor R2 is connected to a drain of the transistor SW1_2. A source of the transistor SW1_2 is connected to a power source (e.g., Vdd≦3.3 V) and a collector of the transistor Q2_2.

The collector of the transistor Q1_2 is also connected to the transistors SW2_2 and Q2_2. Specifically, the collector of the transistor Q1_2 is connected to a drain of the transistor SW2_2 and is connected to a base of the transistor Q2_2. A source of the transistor SW2_2 is connected to the ground.

An emitter of the transistor Q2_2 is connected to a collector of the transistor Q3_2. An emitter of the transistor Q3_2 is connected to the ground. In one embodiment, the emitter of the transistor Q3_2 may be connected to the ground through a resistor.

In the second transimpedance amplifier 14, a node N2, which is connected to a node between the emitter of the transistor Q2_2 and the collector of the transistor Q3_2, configures a feedback node. The node N2 is connected to an output terminal OUT2, thus serving as an output node.

A first end of the second resistor RF2 is connected to the second end of the first resistor RF1, specifically, the feedback node N1. A second end of the second resistor RF2 is connected to the node N2. The capacitor C2 is provided in parallel with the second resistor RF2. In the second transimpedance amplifier 14, a series connection of the first resistor RF1 and the second resistor RF2 configures the feedback resistor of the second transimpedance amplifier 14.

The control logic 16 provides control signals to the first transimpedance amplifier 12 and the second transimpedance amplifier 14. Specifically, the control logic 16 provides the control signals to the transistors Q1_1, SW1_1, SW2_1, and Q3_1 of the first transimpedance amplifier 12 and the control signals to the transistors Q1_2, SW1_2, SW2_2, and Q3_2 of the second transimpedance amplifier 14. Thus, the control logic 16 enables one of the first transimpedance amplifier 12 and the second transimpedance amplifier 14 and disables the other.

In order to enable the first transimpedance amplifier 12, the control logic 16 provides signals to enable the transistors Q1_1, Q3_1, and SW1_1 and to disable the transistor SW2_1.

In order to enable the transistors Q1_1 and Q3_1, the control logic 16 applies a high voltage (e.g., 1.2 V) to the base of the transistor Q1_1 and the base of the transistor Q3_1. In order to enable the transistor SW1_1, the control logic 16 provides a signal to set the transistor SW1_1 to "ON" to the gate of the transistor SW1_1. In the case where the transistor SW1_1 is a PMOS switch, the signal to set the transistor SW1_1 to "ON" is of a low voltage such as 0 V. In order to disable the transistor SW2_1, the control logic 16 provides a signal to set the transistor SW2_1 to "OFF" to the gate of the transistor SW2_1. In the case where the transistor SW2_1 is an NMOS switch, the signal to set the transistor SW2_1 to "OFF" is of a low voltage such as 0 V.

When the first transimpedance amplifier 12 is enabled, the first transimpedance amplifier 12 converts an input current signal received at the node N0 into an output voltage signal at the output terminal OUT1 at a first rate. In the enabled state, voltages are generated at a node B1 between the resistor R1 and the transistor Q1_1 and at the node N1. The voltage at the node N1 corresponds to the output voltage signal.

In order to disable the first transimpedance amplifier 12, the control logic 16 provides signals to disable the transistors Q1_1, Q3_1, and SW1_1 and to enable the transistor SW2_1.

In order to disable the transistors Q1_1 and Q3_1, the control logic 16 applies a low voltage (e.g., 0 V) to the base of the transistor Q1_1 and the base of the transistor Q3_1. In order to disable the transistor SW1_1, the control logic 16 provides a signal to set the transistor SW1_1 to "OFF" to the gate of the transistor SW1_1. In the case where the transistor SW1_1 is a PMOS switch, the signal to set the transistor SW1_1 to "OFF" is of a high voltage such as Vdd. In order to enable the transistor SW2_1, the control logic 16 provides a signal to set the transistor SW2_1 to "ON" to the gate of the transistor SW2_1. In the case where the transistor SW2_1 is an NMOS switch, the signal to set the transistor SW2_1 to "ON" is of a high voltage Vdd.

When the first transimpedance amplifier 12 is disabled, the node B1 is coupled to the ground, and the node N1 has a high impedance.

In order to enable the second transimpedance amplifier 14, the control logic 16 provides signals to enable the transistors Q1_2, Q3_2, and SW1_2 and to disable the transistor SW2_2.

In order to enable the transistors Q1_2 and Q3_2, the control logic 16 applies a high voltage (e.g., 1.2 V) to the base of the transistor Q1_2 and the base of the transistor Q3_2. In order to enable the transistor SW1_2, the control logic 16 provides a signal to set the transistor SW1_2 to "ON" to the gate of the transistor SW1_2. In the case where the transistor SW1_2 is a PMOS switch, the signal to set the transistor SW1_2 to "ON" is of a low voltage such as 0 V. In order to disable the transistor SW2_2, the control logic 16 provides a signal to set the transistor SW2_2 to "OFF" to the gate of the transistor SW2_2. In the case where the transistor SW2_2 is an NMOS switch, the signal to set the transistor SW2_2 to "OFF" is of a low voltage such as 0 V.

When the second transimpedance amplifier 14 is enabled, the second transimpedance amplifier 14 converts, at a second rate, an input current signal received at the node N0 into an output voltage signal at the output terminal OUT2. In the enabled state, voltages are generated at a node B2 between the resistor R2 and the transistor Q1_2 and at the node N2. The voltage at the node N2 corresponds to the output voltage signal.

In order to disable the second transimpedance amplifier 14, the control logic 16 provides signals to disable the transistors Q1_2, Q3_2, and SW1_2 and to enable the transistor SW2_2.

In order to disable the transistors Q1_2 and Q3_2, the control logic 16 applies a low voltage (e.g., 0 V) to the base of the transistor Q1_2 and the base of the transistor Q3_2. In order to disable the transistor SW1_2, the control logic 16 provides a signal to set the transistor SW1_2 to "OFF" to the gate of the transistor SW1_2. In the case where the transistor SW1_2 is a PMOS switch, the signal to set the transistor SW1_2 to "OFF" is of a high voltage such as Vdd. In order to enable the transistor SW2_2, the control logic 16 provides a signal to set the transistor SW2_2 to "ON" to the gate of the transistor SW2_2. In the case where the transistor SW2_2 is an NMOS switch, the signal to set the transistor SW2_2 to "ON" is of a high voltage such as Vdd.

In the disabled state of the second transimpedance amplifier 14, the node B2 is coupled to the ground, and the node N2 has a high impedance.

In the integrated circuit 10 above, the feedback resistor of the second transimpedance amplifier 14 is defined by connecting in series the first resistor RF1 and the second resistor RF2. Accordingly, only the first end of the first resistor RF1 is connected to the input node N0, thus reducing the number of feedback resistors connected to the input node N0. In addition, since the number of connections to the input node N0 is small, the length of the line including the input node can be reduced. Therefore, an increase in the parasitic capacitance and parasitic inductance at the input node N0 is reduced. This improves the performance of the transimpedance amplifier. Furthermore, the resistance value of the feedback resistor of the second transimpedance amplifier 14 is a sum of the resistance value of the first resistor RF1 and the resistance value of the second resistor RF2. Accordingly, the resistance value of the second resistor RF2 can be reduced, and the second resistor RF2 can be reduced in size so that the mounting area thereof can be reduced.

The constants of the elements in the integrated circuit 10 are explained below in one application, in which the integrated circuit 10 is used as a transimpedance amplifier of an optical line terminal in a 10G-EPON asymmetric system defined in the IEEE 802.3av standard. In this system, 10.3125 Gb/s upstream signals and 1.25 Gb/s upstream signals are time-division multiplexed in the same wavelength band and are transmitted from an optical network unit to the optical line terminal. Thus, an optical receiver for the optical line terminal should receive optical signals having different bit rates of 10.3125 Gb/s and 1.25 Gb/s at predetermined receiver sensitivities. Specifically, the receiver sensitivity specifications in IEEE 802.3av require a receiver sensitivity of −28.0 dBm at a BER (bit error rate) of $10^{-3}$ for 10.3125 Gb/s bit-rate signals, and a receiver sensitivity of −29.78 dBm at a BER (bit error rate) of $10^{-12}$ for 1.25 Gb/s bit-rate signals.

In general, the receiver sensitivity of the transimpedance amplifier is optimized by minimizing noise properties while maintaining the bandwidth at approximately 70% or greater of the bit rate. The bandwidth BW of the transimpedance amplifier is represented by an expression $BW=A/(2\pi R_F C_{IN})$, where A indicates the gain of an amplifying unit, $R_F$ indicates the resistance value of a feedback resistor, and $C_{IN}$ indicates the input capacitance.

The input capacitance $C_{IN}$ includes the parasitic capacitance of the input transistor Q0, the capacitance of the phase compensating capacitor (capacitor C1 and/or capacitor C2) converted to the input node (i.e., (1+A) times), and the wiring capacitance of the input node.

In the IEEE 802.3av standard, an APD (avalanche photodiode) is assumed as a light receiving optical device. A general 10G APD is estimated to have a parasitic capacitance of about 0.2 pF. If the capacitance of the initial stage transistor Q0 is 0.3 pF, the gain A of the amplifying unit is 50, the capacitance of the phase compensating capacitor C1 is 10 fF, and the wiring capacitance is 50 fF, then the input capacitance $C_{IN}$ is 1.0 pF. With the first resistor RF1 having a resistance value of 1,000Ω, the first transimpedance amplifier 12 can thus gain a bandwidth of 7.5 GHz.

Similarly, it is desirable that the second transimpedance amplifier 14 have a bandwidth of 900 MHz or greater to process 1.25 Gb/s signals. If the feedback resistance is 5,000 Ω and the capacitance of the phase compensating capacitor is 10 fF, the bandwidth of the second transimpedance amplifier 14 is 1.5 GHz, satisfying the desirable bandwidth. Thus, the resistance value of the second resistor RF2 is 4,000Ω. The capacitance of the capacitor C2 may be 50 fF, for example.

The receiver sensitivity is explained below. It is assumed that the first transimpedance amplifier 12 is optimized for receiving 10.3125 Gb/s signals and has a receiver sensitivity of −28.0 dBm at a BER of $10^{-3}$. Switching to the second transimpedance amplifier 14 reduces the bandwidth from 7.5 GHz to 1.5 GHz. Accordingly, the noise band of the second transimpedance amplifier 14 is also reduced ⅕ times the noise band of the first transimpedance amplifier 12, thus leading to an improvement in the sensitivity by 7 dB. In addition, switching to the second transimpedance amplifier 14 increases the feedback resistance value and increases the transimpedance gain by 7 dB, further improving the receiver sensitivity. This improvement in the receiver sensitivity, which depends on the noise properties of the amplifying unit, is approximately 3 to 5 dB. Thus, a receiver sensitivity of −38 dBm is estimated at a BER of $10^{-3}$ for 1 GHz signals in the second transimpedance amplifier 14. In the case of using an APD as a light receiving device, the reception level difference between the BER of $10^{-3}$ and the BER of $10^{-12}$ is approximately 6 dB. Thus, the second transimpedance amplifier 14 achieves a receiver sensitivity of −32 dBm at a BER of $10^{-12}$, satisfying the receiver sensitivity defined in the IEEE 802.3av standard.

In the transimpedance amplifier, an increase in the number of lines to the input node to support multi-rates generally increases the input capacitance $C_{IN}$ and reduces the bandwidth, as expressed in the expression of the bandwidth BW above. For instance, if the input capacitance increases by 30 fF due to an increase in the number of lines to the input node in the transimpedance amplifier having a gain A of 50 and a feedback resistance of 1,000Ω for 10.3125 Gb/s signals, the bandwidth BW is reduced by 0.2 GHz from 7.5 GHz to 7.3 GHz. To compensate the reduction in the bandwidth of 0.2 GHz, the feedback resistance value should be reduced from 1,000Ω to 970Ω. Such a reduction in the feedback resistance value leads to a reduction of the transimpedance gain and thus a reduction in the receiver sensitivity of the transimpedance amplifier by 0.1 to 0.2 dB. Similarly, an increase in the input capacitance by 50 fF reduces the receiver sensitivity by 0.2 to 0.3 dB. The transimpedance amplifier of the embodiment, however, can support multi-rates without increasing the number of lines, thus capable of maintaining the receiver sensitivity.

Figure 2:
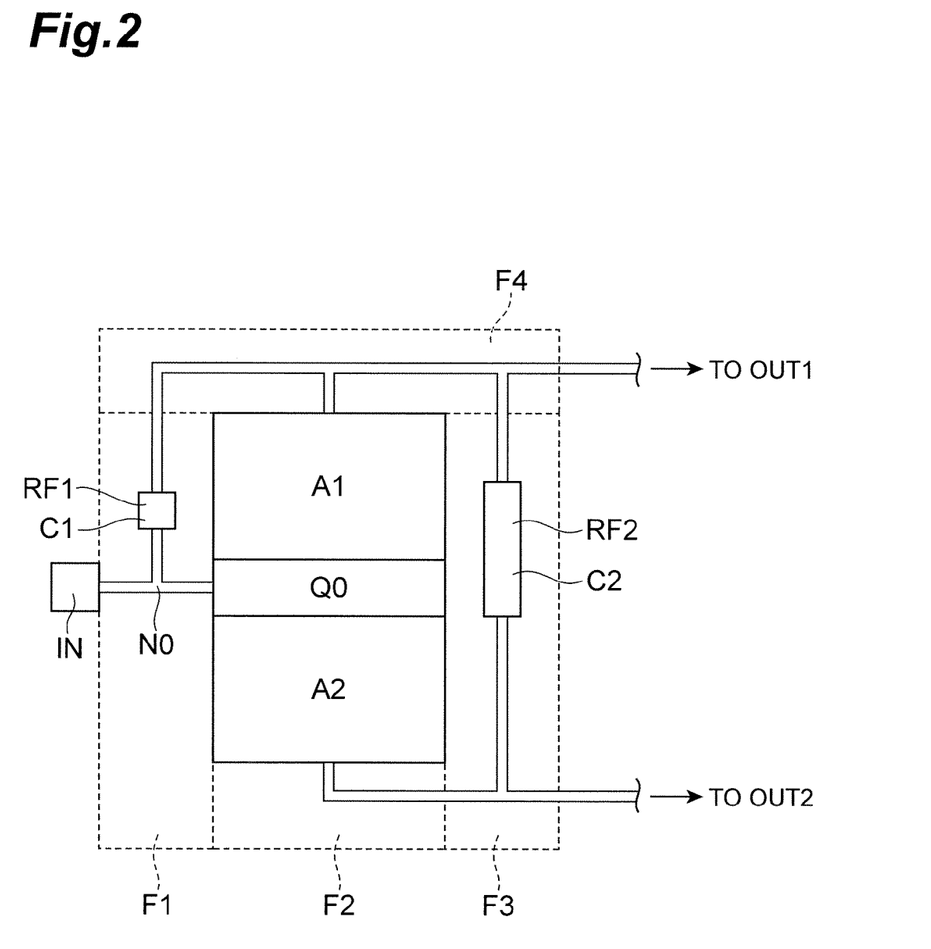
FIG. 2 illustrates a layout of a transimpedance amplifier according to one embodiment.

A circuit layout that can be employed for the integrated circuit 10 is explained below. FIG. 2 is a plan view illustrating a layout of a transimpedance amplifier according to one embodiment. As shown in FIG. 2, the integrated circuit 10 includes regions F1, F2, F3, and F4. The regions F1, F2, and F3 are arranged sequentially in a first direction. The region F4 is adjacent to the regions F1, F2, and F3 in a second direction intersecting with the first direction.

The region F1 has a line including the node N0. In the embodiment, the first resistor RF1 is provided in the region F1. Instead, the first resistor RF1 may be provided in the fourth region F4.

In the region F2, amplifying units A1 and A2, and the input transistor Q0 are provided. The input transistor Q0 is provided between the amplifying units A1 and A2 in the second direction. The amplifying unit A1 includes the first transistor Q1_1, the resistor R1, and the transistors SW1_1, SW2_1, Q2_1, and Q3_1. The amplifying unit A2 includes the second transistor Q1_2, the resistor R2, and the transistors SW1_2, SW2_2, Q2_2, and Q3_2.

In the region F3, the second resistor RF2 is provided. The line connecting the second resistor RF2 and the first resistor RF1 extends through the regions F3 and F4. According to the layout shown in FIG. 2, the second resistor RF2 and the line connecting the first resistor RF1 and the second resistor RF2 can be provided in other regions than the region F1. Thus, the width of the region F1 can be reduced in the first direction. Accordingly, the parasitic capacitance of the input node N0 can be reduced. The second resistor RF2 may be provided in the fourth region F4. In this case, the line connecting the first resistor RF1 and the second resistor RF2 is provided only in the fourth region F4.

Figure 3:
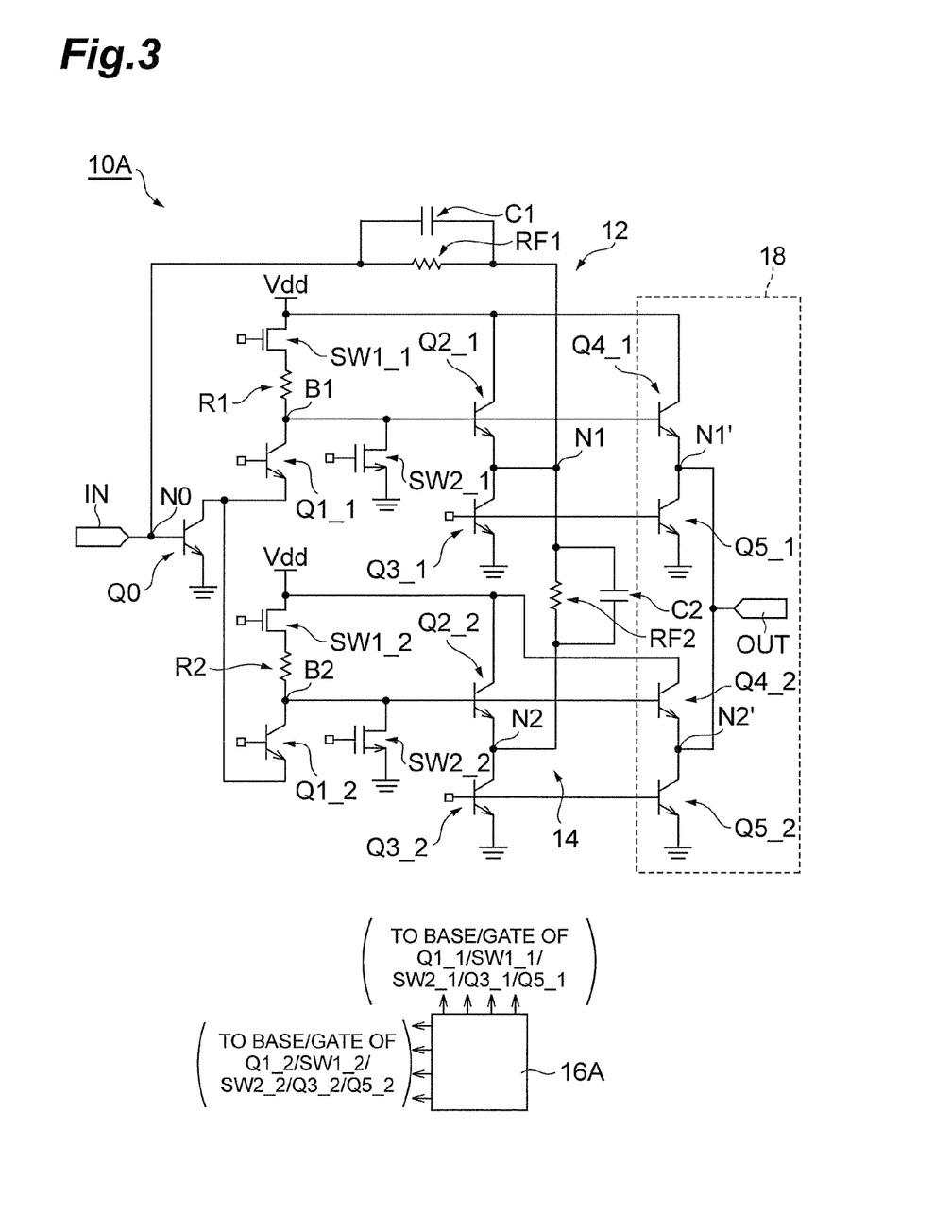
FIG. 3 is a circuit diagram illustrating a transimpedance amplifier according to another embodiment.

A modification of the integrated circuit 10 is explained below. FIG. 3 is a circuit diagram illustrating a transimpedance amplifier according to another embodiment. In addition to the components of the integrated circuit 10, an integrated circuit 10A shown in FIG. 3 is further provided with an output sub-circuit 18.

The output sub-circuit 18 includes transistors Q4_1, Q5_1, Q4_2, and Q5_2. The transistors Q4_1, Q5_1, Q4_2, and Q5_2 are, for example, npn bipolar junction transistors.

A collector of the transistor Q4_1 is connected to the power source. A base of the transistor Q4_1 is connected to the base of the transistor Q2_1. An emitter of the transistor Q4_1 is connected to a collector of the transistor Q5_1. A base of the transistor Q5_1 is connected to the base of the transistor Q3_1. The emitter of the transistor Q5_1 is coupled to the ground. The transistor Q4_1 operates similarly to the transistor Q2_1. The transistor Q5_1 operates similarly to the transistor Q3_1.

A collector of the transistor Q4_2 is connected to the power source. A base of the transistor Q4_2 is connected to the base of the transistor Q2_2. An emitter of the transistor Q4_2 is connected to a collector of the transistor Q5_2. The base of the transistor Q5_2 is connected to the base of the transistor Q3_2. An emitter of the transistor Q5_2 is coupled to the ground. The transistor Q4_2 operates similarly to the transistor Q2_2. The transistor Q5_2 operates similarly to the transistor Q3_2.

A node N1' between the emitter of the transistor Q4_1 and the collector of the transistor Q5_1 configures the output node of the first transimpedance amplifier 12 and is connected to a common output terminal OUT. A node N2' between the emitter of the transistor Q4_2 and the collector of the transistor Q5_2 configures the output node of the second transimpedance amplifier 14 and is connected to the common output terminal OUT.

Thus, the first transimpedance amplifier 12 and the second transimpedance amplifier 14 may share the output node.

Figure 4:
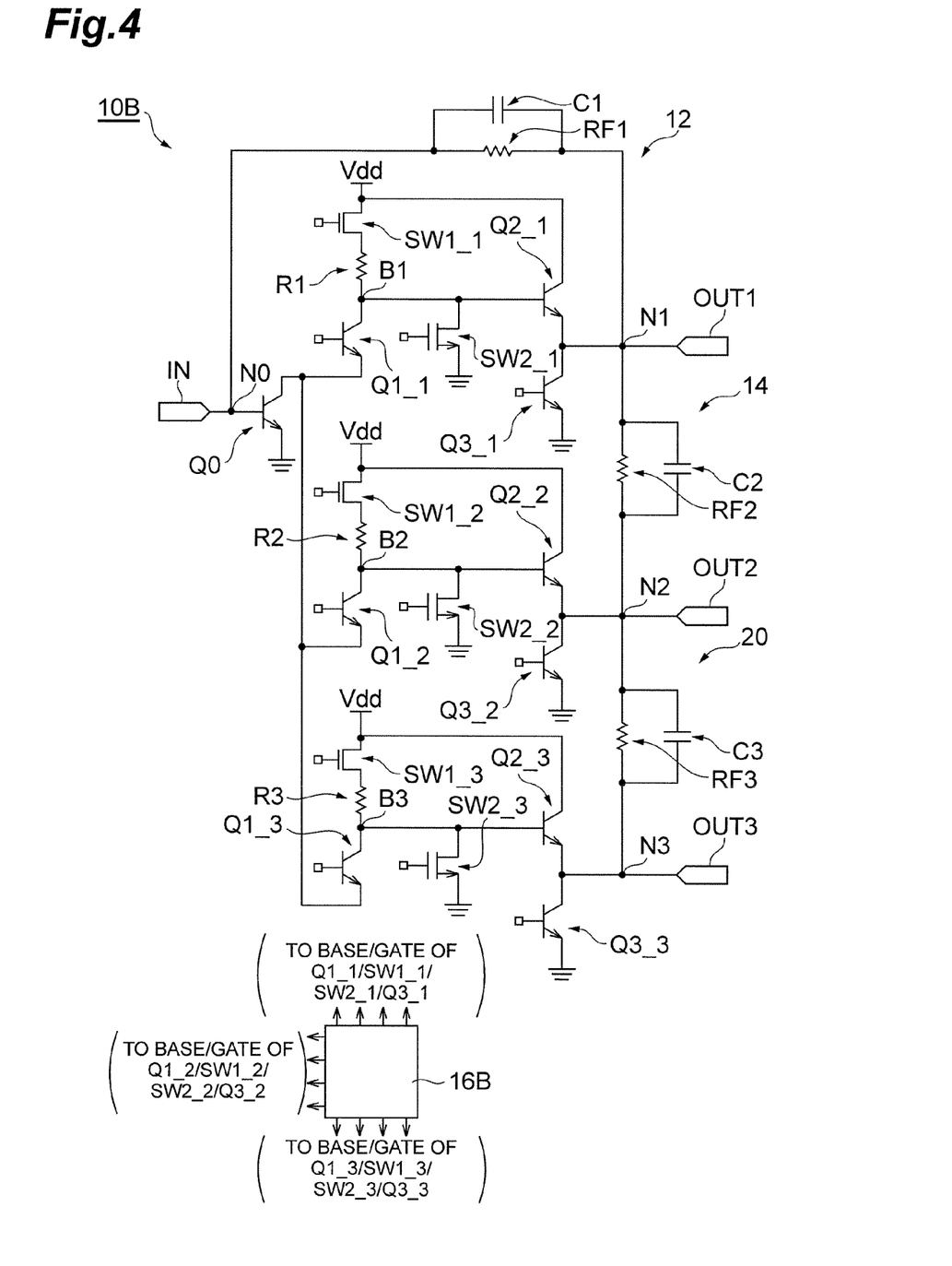
FIG. 4 is a circuit diagram of a transimpedance amplifier according to another embodiment.

A transimpedance amplifier according to still another embodiment is explained below. FIG. 4 is a circuit diagram of the transimpedance amplifier according to still another embodiment. The transimpedance amplifier shown in FIG. 4 is also configured as an integrated circuit 10B. In addition to the components of the integrated circuit 10, the integrated circuit 10B is further provided with a third transimpedance amplifier 20.

The third transimpedance amplifier 20 includes the input transistor Q0, a third transistor Q1_3, and a third resistor RF3. The third transistor Q1_3 is, for example, an npn bipolar junction transistor.

The third transimpedance amplifier 20 may further include a resistor R3, a capacitor C3, and transistors SW1_3, SW2_3, Q2_3, and Q3_3. The transistors SW1_3 and SW2_3 are, for example, MOS switches. The transistors Q2_3 and Q3_3 are, for example, npn bipolar junction transistors.

In the third transimpedance amplifier 20, the input transistor Q0, the third transistor Q1_3, and the resistor R3 configure a third cascode amplifier. An emitter of the third transistor Q1_3 is connected to the collector of the input transistor Q0. A collector of the third transistor Q1_3 is connected to a first end of the resistor R3.

A second end of the resistor R3 is connected to the transistor SW1_3. Specifically, the second end of the resistor R3 is connected to a drain of the transistor SW1_3. A source of the transistor SW1_3 is connected to a power source (e.g., Vdd≦3.3 V) and a collector of the transistor Q2_3.

The collector of the transistor Q1_3 is also connected to the transistors SW2_3 and Q2_3. Specifically, the collector of the transistor Q1_3 is connected to a drain of the transistor SW2_3 and is connected to a base of the transistor Q2_3. A source of the transistor SW2_3 is coupled to the ground.

An emitter of the transistor Q2_3 is connected to a collector of the transistor Q3_3. An emitter of the transistor Q3_3 is coupled to the ground. In one embodiment, the emitter of the transistor Q3_3 may be coupled to the ground through a resistor.

In the third transimpedance amplifier 20, a node N3, which is connected to a node between the emitter of the transistor Q2_3 and the collector of the transistor Q3_3, configures a feedback node. The node N3 is also connected to an output terminal OUT3, thus serving as an output node.

A first end of the third resistor RF3 is connected to the second end of the second resistor RF2, specifically, the feedback node N2. A second end of the third resistor RF3 is connected to the node N3. The capacitor C3 is provided in parallel with the third resistor RF3. In the third transimpedance amplifier 20, a series connection of the first resistor RF1, the second resistor RF2, and the third resistor RF3 thus configures the feedback resistor of the third transimpedance amplifier 20.

In the integrated circuit 10B, a control logic 16B provides control signals to the first transimpedance amplifier 12, the second transimpedance amplifier 14, and the third transimpedance amplifier 20. Thus, one of the first transimpedance amplifier 12, the second transimpedance amplifier 14, and the third transimpedance amplifier 20 is enabled and the other transimpedance amplifiers are disabled.

In order to enable the third transimpedance amplifier 20, the control logic 16B provides signals to enable the transistors Q1_3, SW1_3, and Q3_3 and to disable the transistor SW2_2, similar to the cases of the first and second transimpedance amplifiers. In order to disable the third transimpedance amplifier 20, the control logic 16B provides signals to disable the transistors Q1_3, SW1_3, and Q3_3 and to enable the transistor SW2_2, similar to the cases of the first and second transimpedance amplifiers.

When the third transimpedance amplifier 20 is enabled, the third transimpedance amplifier 20 converts an input current signal received at the node N0 into an output voltage signal at the output terminal OUT3, at a third rate. In the enabled state, voltages are generated at a node B3 between the resistor R3 and the transistor Q1_3 and at the node N3. The voltage at the node N3 corresponds to the output voltage signal. In the disabled state of the third transimpedance amplifier 20, the node B3 is coupled to the ground, and the node N3 has a high impedance.

The transimpedance amplifier according to the present invention may have a plurality of transimpedance amplifiers supporting three or more bit rates, as illustrated with the integrated circuit 10B. Furthermore, a series connection of the preceding resistor and the subsequent resistor defines the feedback resistor of the subsequent transimpedance amplifier. Thus, the number of lines connected to the input node N0 can be reduced. In addition, the resistance value of the subsequent resistor, which is a portion of the feedback resistor, can be reduced, and thus the size of the subsequent resistor can be reduced.

The constants of the elements in the integrated circuit 10B are explained below in one application, in which the first transimpedance amplifier 12 supports 10 Gb/s signals, the second transimpedance amplifier 14 supports 2.48 Gb/s signals, and the third transimpedance amplifier 20 supports 1.24 Gb/s signals. The bit rates of 2.48 Gb/s and 1.24 Gb/s are defined as G-PON in the ITU-T G984 recommendation. The bit rate of 10 Gb/s is being discussed as a next generation PON.

In a design similar to that described above in the integrated circuit 10, if the first resistor RF1 has a resistance of 1,000 Ω and the capacitor C1 has a capacitance of 10 fF, the first transimpedance amplifier 12 has a bandwidth of 7.5 GHz. If the second resistor RF2 has a resistance of 2,000 Ω and the capacitor C2 has a capacitance of 30 fF, the second transimpedance amplifier 14 has a bandwidth of 2.5 GHz. If the third resistor RF3 has a resistance of 2,000 Ω and the capacitor C3 has a capacitance of 50 fF, the third transimpedance amplifier 20 has a bandwidth of 1.5 GHz. Thus, the first to third transimpedance amplifiers ensure the bandwidths of approximately 70% or greater of the bit rates.

The receiver sensitivity is explained below. It is assumed that the receiver sensitivity of the first transimpedance amplifier 12 is optimized so as to achieve a receiver sensitivity of −28 dBm at a BER of $10^{-3}$. In this case, the resistance value of the feedback resistor of the second transimpedance 14 is 3,000Ω, which is three times the resistance value of the feedback resistor of the first transimpedance amplifier 12. Thus, in the second transimpedance amplifier 14, the noise band is ⅓ times that of the first transimpedance amplifier 12 and the transimpedance gain triples. Accordingly, the sensitivity is estimated to improve by approximately 7 to 9 dB in the second transimpedance amplifier 14, achieving a receiver sensitivity of −35.0 dBm at a BER of $10^{-3}$. The third transimpedance amplifier 20 achieves a receiver sensitivity of −32.0 dBm at a BER of $10^{-12}$.

Figure 5:
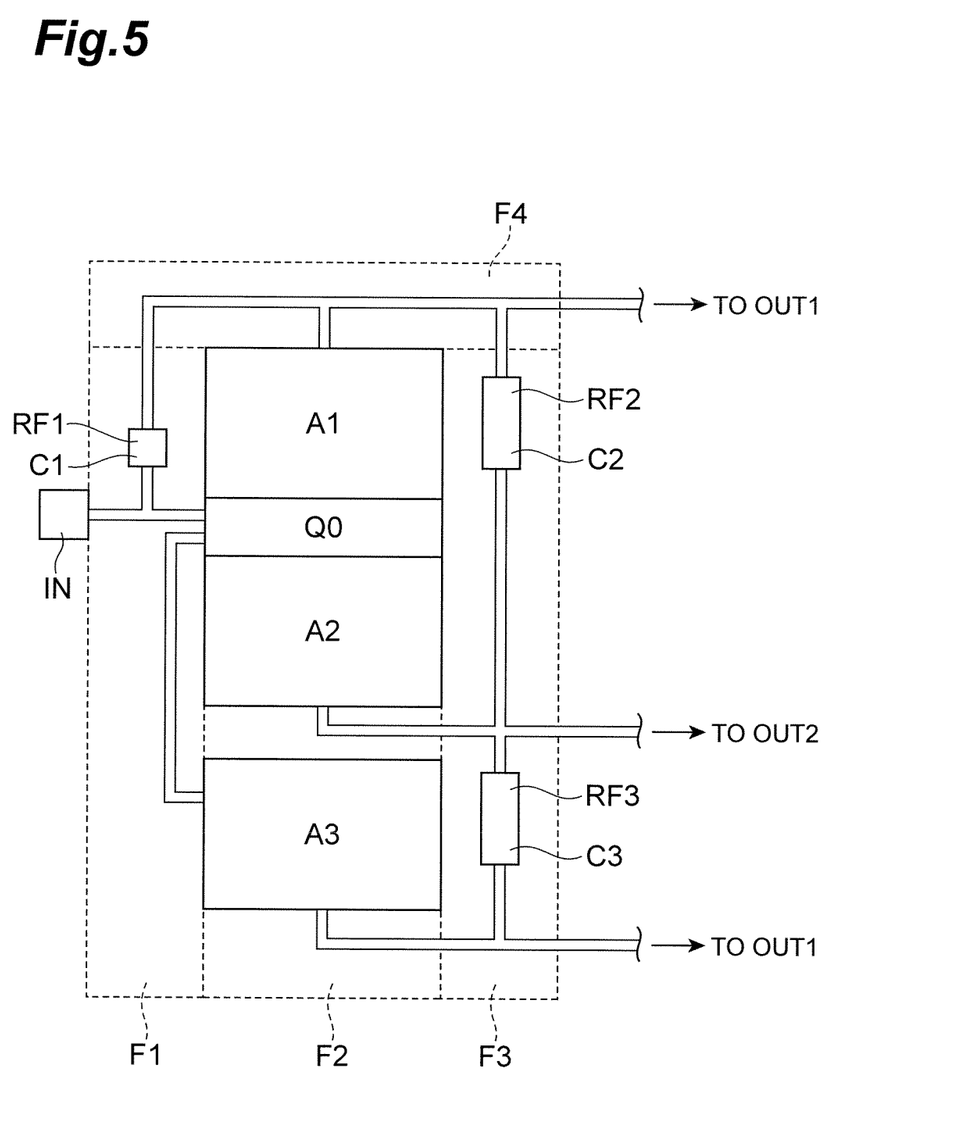
FIG. 5 illustrates a layout illustrating a transimpedance amplifier according to one embodiment.

A circuit layout that can be employed for the integrated circuit 10B is explained below. FIG. 5 is a plan view illustrating a layout of a transimpedance amplifier according to one embodiment. Differences from the layout shown in FIG. 2 are explained herein with respect to the circuit layout shown in FIG. 5.

As shown in FIG. 5, an amplifying unit A3 is further provided in the second region F2. The amplifying unit A3 includes the third transistor Q1_3, the resistor R3, and the transistors SW1_3, SW2_3, Q2_3, and Q3_3.

In the third region F3, a third resistor RF3 is further provided. The line connecting the third resistor RF3 and the second resistor RF2 extends through the third region F3. According to the layout shown in FIG. 5, the second resistor RF2, the third resistor RF3, the line connecting the first resistor RF1 and the second resistor RF2, and the line connecting the second resistor RF2 and the third resistor RF3 can be provided in other regions than the region F1. Thus, the width of the region F1 can be reduced in the first direction. Accordingly, the parasitic capacitance of the input node N0 can be reduced.

Figure 6:
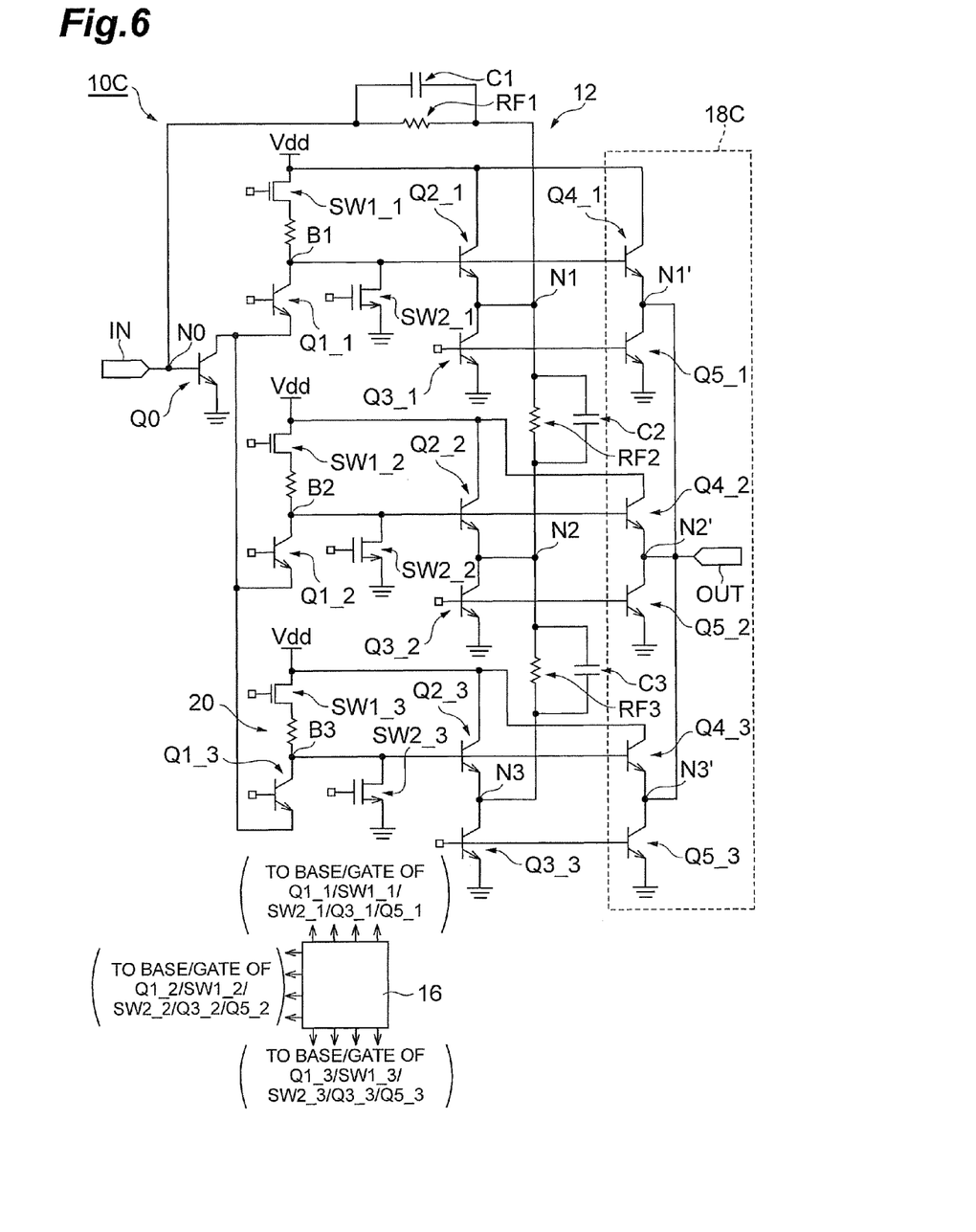
FIG. 6 is a circuit diagram illustrating a transimpedance amplifier according to another embodiment.

A modification of the integrated circuit 10B is explained below. FIG. 6 is a circuit diagram illustrating a transimpedance amplifier according to still another embodiment. In addition to the components of the integrated circuit 10B, an integrated circuit 10C shown in FIG. 6 is further provided with an output sub-circuit 18C. Differences from the output sub-circuit 18 are explained herein with respect to the output sub-circuit 18C.

In addition to the components of the output sub-circuit 18, the output sub-circuit 18C includes transistors Q4_3 and Q5_3. A collector of the transistor Q4_3 is connected to the power source. A base of the transistor Q4_3 is connected to the base of the transistor Q2_3. An emitter of the transistor Q4_3 is connected to a collector of the transistor Q5_3. A base of the transistor Q5_3 is connected to the base of the transistor Q3_3. An emitter of the transistor Q5_3 is coupled to the ground. The transistor Q4_3 operates similarly to the transistor Q2_3. The transistor Q5_3 operates similarly to the transistor Q3_3.

A node N3' between the emitter of the transistor Q4_3 and the collector of the transistor Q5_3 configures the output node of the third transimpedance amplifier 20. In addition to the nodes N1' and N2', the node N3' is also connected to the common output terminal OUT. Thus, output nodes of three or more transimpedance amplifiers may be connected to the common output terminal.

Figure 7:
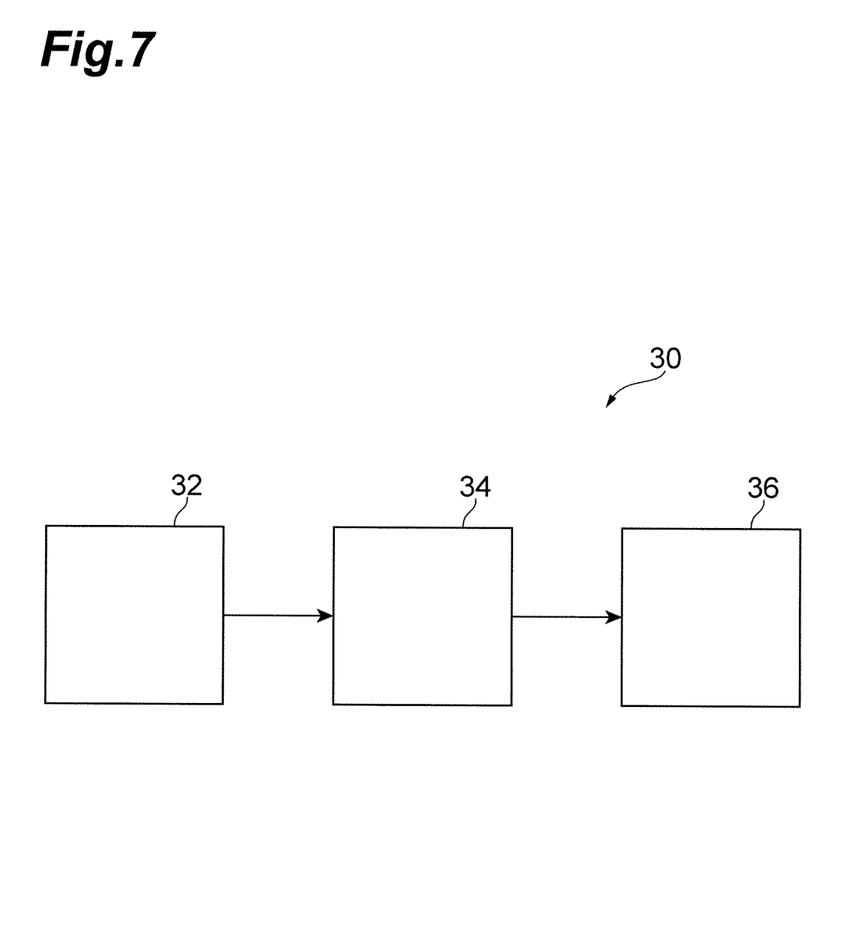
FIG. 7 illustrate a photodetection system according to one embodiment.

A photodetection system is explained below to which the transimpedance amplifier or the output circuit explained above can be applied. FIG. 7 illustrates a photodetection system according to one embodiment. The system 30 shown in FIG. 7 can be used for various applications in optical communication systems. The system 30 has a photodetector 32, a transimpedance amplifier 34 (e.g., the integrated circuit 10, 10A, 10B, or 10C), and a limiting amplifier 36.

The photodetector 32 is a current source in the embodiment. The photodetector 32 may be a photodiode, for example, which receives photons and generates a current signal (e.g., photocurrent) in response thereto.

The transimpedance amplifier 34 receives the current signal from the photodetector 32 and converts the current signal into a voltage signal at one among a plurality of rates, for example. The limiting amplifier 36 receives the voltage signal from the transimpedance amplifier 34 and attenuates the voltage signal, for example, thus protecting the subsequent stage in the system 30 from input overdrive.

The principles of the present invention has been illustrated and described in various embodiments, but it is apparent to a person skilled in the art that the present invention can be modified in arrangement and detail without departing from such principles. The present invention is not limited to the specific configurations disclosed in the embodiments. We, therefore, claim rights to all variations and modifications coining with the spirit and the scope of claims.

REFERENCE SIGNS LIST 10, 10A, 10B, 10C: Integrated circuit (transimpedance amplifier); 12: Transimpedance amplifier; 14: Second transimpedance amplifier; 16, 16B: Control logic; 18, 18C: Output sub-circuit; 20: Third transimpedance amplifier; IN: Input terminal; N0: Input node; N1-N3: Feedback node; OUT: Common output terminal; OUT1, OUT2, OUT3: Output terminal; Q0: Input transistor; Q1_1: First transistor; Q1_2: Second transistor; Q1_3: Third transistor; Q2_1, Q2_2, Q2_3, Q3_1, Q3_2, Q3_3, Q3_3, Q4_1, Q4_2, Q4_3, Q5_1, Q5_2, Q5_3: Transistor; R1, R2, R3: Resistor; RF1: First resistor; RF2: Second resistor; RF3: Third resistor; SW1_1, SW1_2, SW1_3, SW2_1, SW2_2, SW2_3: Transistor.

The invention claimed is:

1. An integrated circuit comprising:
a first transimpedance amplifier comprising:
an input transistor connected to an input node;
a first transistor coupled in cascode to the input transistor;
a first resistor having a first end connected to the input node and a second end connected to a feedback node; and
a switch for switching the first transimpedance amplifier between an enabled state and a disabled state; and
a second transimpedance amplifier comprising:
the input transistor;
a second transistor coupled in cascode to the input transistor;
the first resistor;
a second resistor having a first end and a second end; and
a switch for switching the second transimpedance amplifier between an enable state and a disabled state, wherein
the first end of the second resistor is connected to the second end of the first resistor, and the second end of the second resistor is connected to a feedback node of the second transimpedance amplifier.

2. The integrated circuit according to claim 1, further comprising:
a control logic supplying control signals to the switch of the first transimpedance amplifier and the switch of the second transimpedance amplifier so that one of the first transimpedance amplifier and the second transimpedance amplifier is set into the enable state while the other of the first transimpedance amplifier and the second transimpedance amplifier is set into the disabled state.

3. The integrated circuit according to claim 1, further comprising:
a first region, a second region, and a third region, the first region, the second region, and the third region being arranged sequentially in a first direction; and
a fourth region being adjacent to the first to third regions in a second direction intersecting with the first direction, wherein a line including the input node is provided in the first region, the input transistor, the first transistor, the switch of the first transimpedance amplifier, the second transistor, and the switch of the second transimpedance amplifier are provided in the second region, wherein the first resistor is provided in one of the first region and the fourth region, the second resistor is provided in one of the third region and the fourth region, and a line connecting the second end of the first resistor and the first end of the second resistor extends through the fourth region.

4. A transimpedance amplifier comprising:
a first transimpedance amplifier comprising:
  an input transistor connected to an input node;
  a first transistor coupled in cascode to the input transistor;
  a first resistor having a first end connected to the input node and a second end connected to a feedback node; and
  a switch for disabling the first transimpedance amplifier; and
a second transimpedance amplifier comprising:
  the input transistor;
  a second transistor coupled in cascode to the input transistor;
  the first resistor;
  a second resistor having a first end and a second end; and
  a switch for disabling the second transimpedance amplifier, wherein
the first end of the second resistor is connected to the second end of the first resistor, and the second end of the second resistor is connected to a feedback node of the second transimpedance amplifier.

5. A system comprising:
a current source; and
an integrated circuit converting a current from the current source into a voltage,
the integrated circuit comprising:
  a first transimpedance amplifier comprising:
    an input transistor connected to an input node connected to the current source;
    a first transistor coupled in cascode to the input transistor;
    a first resistor having a first end connected to the input node and a second end connected to a feedback node; and
    a switch for disabling the first transimpedance amplifier; and
  a second transimpedance amplifier comprising:
    the input transistor;
    a second transistor coupled in cascode to the input transistor;
    the first resistor;
    a second resistor having a first end and a second end; and
    a switch for disabling the second transimpedance amplifier, wherein
  the first end of the second resistor is connected to the second end of the first resistor, and the second end of the second resistor is connected to a feedback node of the second transimpedance amplifier.

* * * * *